Figure 1:
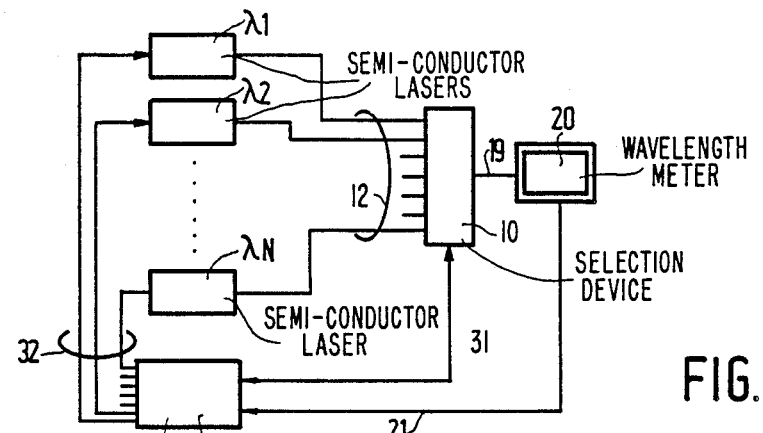

United States Patent [19]
Khoe et al.

[11] Patent Number: 4,942,568
[45] Date of Patent: Jul. 17, 1990

[54] OPTICAL TRANSMISSION DEVICE

[75] Inventors: Giok D. Khoe; Ching K. Wong, both of Eindhoven, Netherlands

[73] Assignee: U.S. Phillips Corporation, New York, N.Y.

[21] Appl. No.: 143,872

[22] Filed: Jan. 13, 1988

[30] Foreign Application Priority Data

Jan. 19, 1987 [NL] Netherlands .......................... 8700108

[51] Int. Cl.$^5$ ....................... H04B 10/04; H04J 14/02
[52] U.S. Cl. ......................................... 370/3; 455/619
[58] Field of Search ............... 455/609, 600, 607, 611, 455/612, 619; 370/1, 3; 372/32, 23, 28

[56] References Cited

U.S. PATENT DOCUMENTS 4,583,228 4/1986 Brown et al. .......................... 372/32
4,630,254 12/1986 Tseng ........................................ 370/1

FOREIGN PATENT DOCUMENTS 2170370 7/1986 United Kingdom ..................... 370/3

OTHER PUBLICATIONS

E. J. Bachus et al., "Coherent Optical Fibre Subscriber Line", IOOC-ECOC '85, pp. 61-64 (Oct. 1985).

Primary Examiner—Joseph A. Orsino
Assistant Examiner—L. Van Beek
Attorney, Agent, or Firm—Anne E. Barschall

[57] ABSTRACT

In an optical transmission device comprising a plurality of semiconductor lasers ($\lambda_1, \ldots, \lambda_N$) for transmitting an equal plurality of information streams, the wavelengths of the radiation beams from the lasers are stabilised by successively selecting them and then measuring them by means of a wavelength meter (20) and subsequently by correcting them. Since the wavelength of the radiation emitted by each laser may vary within limits imposed by neighbouring wavelengths, a high measuring rate of the wavelength meter is not required.

7 Claims, 1 Drawing Sheet

OPTICAL TRANSMISSION DEVICE

The invention relates to an optical transmission device including a plurality of semiconductor lasers for transmitting an equal number of respective radiation beams modulated with an information stream and having a wavelength which is different for each information stream. The device also includes a measuring system for measuring each wavelength and a control device for influencing the wavelengths of the semiconductor lasers as a function of a signal generated by the measuring system.

Optical transmission lines in the form of glass fibres are increasingly being used for transmitting information. Due to the large transmission capacity of glass fibres, large information streams can be presented to a subscriber. Such an information stream may be, for example a television broadcast, another video or audio programme, or data from a central file. By using a wavelength-sensitive receiver a multitude of programmes, each with their own carrier frequency, can be presented from which the subscriber can simply make a choice by means of tuning. Radiation in the wavelength range of 1.3 to 1.55 $\mu m$ is attenuated to only a slight extent in the glass fibre so that this is one of the ranges which is suitable for the transmission of information through a glass fibre. Several hundred information streams, each with their own carrier frequency, can be transmitted within this range.

In a central transmission device each information stream is transmitted as a series of optical signals by a semiconductor laser. With the aid of a system of beam-splitting and beam-combining elements, the signals are passed through a plurality of glass fibre transmission lines each leading to a subscriber.

The wavelength of radiation emitted by a semiconductor laser is dependent on a number of parameters, inter alia external parameters, for example the ambient temperature. The wavelength thus tends to drift when one or more of these parameters varies. In order to prevent confusion to the subscriber about the selected programme, the wavelength of the carrier signal is to be maintained constant in an optical transmission device.

An optical transmission device of this type is known from the contribution by E. J. Bachus et al. to the conference IOOC-ECOC '85 held in Venice (Italy) in October 1985, entitled "Coherent optical fibre subscriber line", pages 61-64 of the report. This report describes an optical transmission device of the type described in the opening paragraph in which the wavelengths of each semiconductor laser are stabilized.

The known device comprises three semiconductor lasers for transmitting three information streams. The radiation beams generated by the lasers are combined and split towards two outputs. Radiation from one output is further passed on to a receiver, radiation from the other output is combined with radiation generated by a control laser. The wavelength of the radiation emitted by the control laser is varied by means of a sawtooth generator over the wavelength range of the three lasers. When the wavelength of the radiation of the control laser is equal to the wavelength of the radiation of one of the three other lasers, this is detected by means of a pulse detector. By comparing the voltage at the output of the sawtooth generator at that instant with the nominal value of the wavelength of the associated semiconductor laser, a possible deviation between the real and the nominal value can be determined. By modifying the temperature the relevant laser is then tuned.

In order to prevent drift of the wavelength range covered by the control laser, one of the semiconductor lasers is absolutely stabilized by means of a feedback incorporating a fibre ring resonator. An apparent deviation from the wavelength of the radiation from this laser is corrected by modifying the temperature of the control laser.

A drawback of the known device is that the fibre ring resonator must be shielded extremely carefully from external influences in order to prevent the resonant frequency from changing. Furthermore a fibre ring resonator is bulky and is therefore not satisfactorily suitable to be built in a compact transmission device.

A second drawback of the known optical transmission device is that the wavelength of the semiconductor lasers is determined by comparing two quantities, namely the output voltage of the sawtooth generator and the wavelength of the radiation generated in the control laser, which quantities are indirectly coupled via a number of parameters of the control laser. If in the course of time one or more of these parameters starts deviating, for example after a replacement of this laser, the transmission frequencies of the semiconductor lasers which are not absolutely stabilized change.

It is an object of the invention to provide an optical transmission device in which these drawbacks do not occur.

To this end the optical transmission device according to the invention is characterized in that the measuring system comprises a wavelength-meter and a selection device for successively and temporally selecting and determining the wavelengths of the radiation beams generated by each semiconductor laser.

The wavelength-meter is substantially insensitive to external influences which may occur in the transmission device. The wavelength-meter may also be arranged without any problem at some distance from the semiconductor lasers so that a compact build-up remains possible. The wavelength-meter directly measures a wavelength, and conversion via a number of possibly uncertain parameters is thus superfluous.

It is no drawback when there is a relatively large time interval between two successive measurements on one and the same semiconductor laser if the mutual distance between the frequency ranges of different semiconductor lasers is chosen to be so large that during the time interval the drift covers not more than a portion of the frequency interval. In that case confusion to the subscriber is not possible and the receiver can be automatically tuned.

A first embodiment of the optical transmission device according to the invention is characterized in that the selection device is a switching device for establishing and interrupting a radiation path from each semiconductor laser to the wavelength-meter. In this embodiment the wavelength of each semiconductor laser is measured directly.

This embodiment of the optical transmission device according to the invention may be further characterized in that the switching device comprises electro-optical means for establishing and interrupting the respective radiation paths. Consequently, moving parts in the switching device are not necessary.

A second embodiment of the optical transmission device according to the invention in which the transmission device comprises a control laser and a system of beam-combining elements. The control laser is suitable for emitting radiation whose wavelength is variable throughout the wavelength range of the semiconductor lasers. The system of beam-combining element is arranged in the radiation path of the radiation emitted by the semiconductor lasers and the control laser for obtaining at, at least one output of the system, a combined radiation beam comprising at least a portion of the radiation from each laser. The selection device of the transmission device comprises the control laser. An opto-electric converter cooperates with the control laser. The wavelength-meter is arranged in a radiation path of radiation from the control laser. The wavelength range of the opto-electric converter is smaller than the difference of the nominal wavelengths of the semiconductor lasers. As a result of the limited wavelength range the opto-electric converter only supplies an AC signal when the wavelength of the radiation emitted by the control laser is substantially equal to that of one of the semiconductor lasers. By measuring this wavelength at that instant also the wavelength of the radiation emitted by the relevant semiconductor laser is determined by means of a direct measurement.

This embodiment may be further characterized in that the wavelength of the radiation from the control laser is variable by changing both the temperature of and the intensity of the current through the control laser. Consequently, a wavelength range can be covered which is larger than the wavelength range which can be covered by means of a current control only. The number of semiconductor lasers in the optical transmissions device according to the invention may thus be larger than in the device which is known from the afore-mentioned contribution by E. J. Bachus et al. to IOOC-ECOC '85.

The optical transmission device according to the invention is further characterized in that the wavelengths of the radiation emitted by the semiconductor lasers are influenced by influencing the temperature of and the intensity of the current through the semiconductor lasers. The current flowing through the semiconductor laser influences the optical properties of the laser so that a wavelength control is possible which reacts more rapidly than a temperature change alone.

Figure 2:
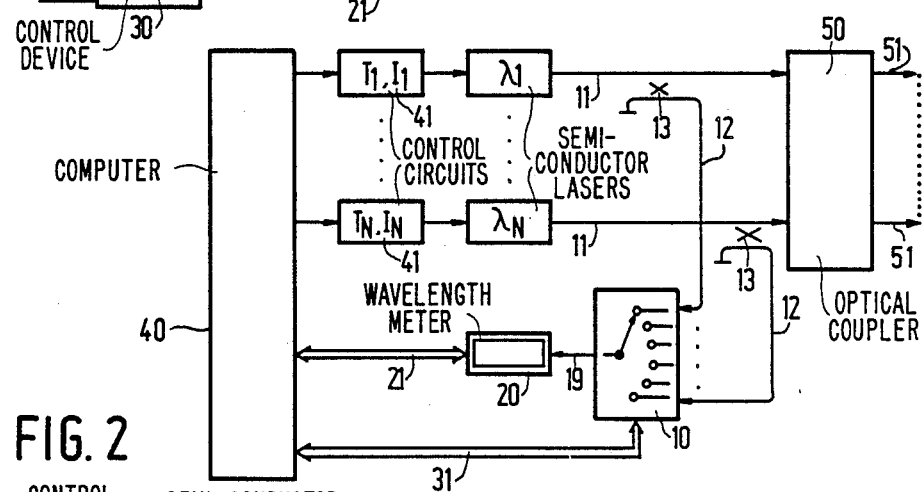
Figure 3:
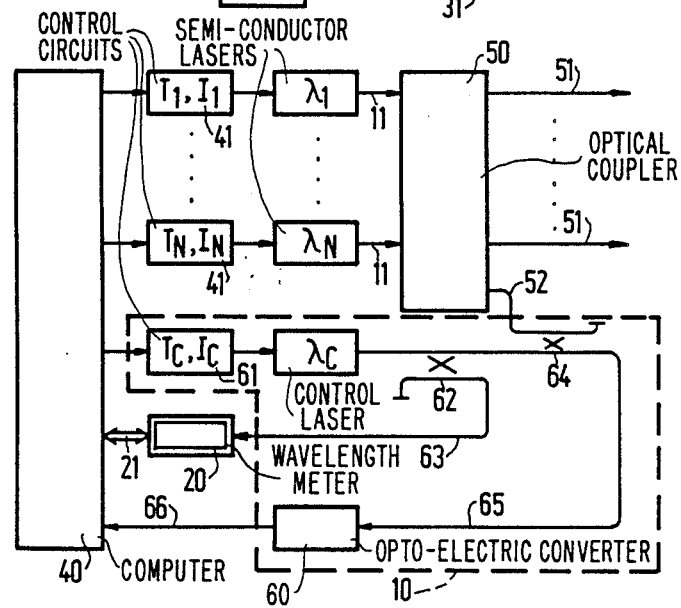

The invention will now be described in greater detail with reference to the accompanying drawing in which FIG. 1 shows diagrammatically the stabilisation system in an optical transmission device according to the invention, FIG. 2 shows diagrammatically a first embodiment of the optical transmission device and FIG. 3 shows diagrammatically a second embodiment of the optical transmission device.

In FIG. 1 the series $\lambda_1, \lambda_2, \ldots, \lambda_N$ denotes a plurality of semiconductor lasers. Radiation from each laser is applied via the bundle of fibres 12 to the selection device 10. The output 19 of the selection device 10 emits radiation whose wavelength corresponds to the wavelength of the radiation entering one of the inputs. This wavelength is measured in the wavelength-meter 20 whereafter the value thereof is passed on via the connection 21 to the control device 30. In the case of a difference between the real and nominal values of the wavelength, the temperature of and/or the intensity of the current through the relevant laser is adapted via one of the connections 32 from the control device 30, so that the transmitted wavelength is corrected.

FIG. 2 shows diagrammatically a first embodiment of an optical transmission device according to the invention. The outputs of the semiconductor lasers $\lambda_1, \ldots, \lambda_N$ are connected to the star coupler 50 via the connection paths 11, for example optical fibres. This coupler combines the radiation which enters each input and splits the combined radiation into a number of radiation beams each of which is passed to a subscriber via one of the outputs 51. Each radiation beam comprises radiation from all semiconductor lasers $\lambda_1$ to $\lambda_N$.

A coupler 13 which couples out a portion of the radiation propagating through the connection 11 and leads it via the connection 12 to the selection device 10 is arranged between each semiconductor laser $\lambda_1$ to $\lambda_N$ and the star coupler. The selection device selects one of the presented signals and passes it on to the wavelength meter 20 via the connection 19. The numerical value measured by the wavelength meter is passed on via the connection 21 to the control device incorporated in a computer 40. The selection device 10 is connected to the computer 40 via the connection 31 so that information relating to the selected semiconductor laser is present in the control device. With the aid of the computer the real value of the wavelength is compared with the nominal value for the selected semiconductor laser and in the case of a deviation the temperature of and/or the intensity of the current through the laser is adapted by means of the control circuits 41 provided for this purpose.

The information streams which must be passed on by the lasers may be presented to the lasers via the computer 40 and the control circuits 41, but alternatively a separate information-processing system may be incorporated in the device for this purpose.

The most important requirement imposed on the wavelength meter is that it must be have a satisfactory stability independent of ambient influences such as temperature and atmospheric pressure. Since drift of the real wavelengths of the semiconductor lasers can be tolerated within limits determined by the nominal distance between neighbouring channels, a high measuring rate is much less important. A wavelength meter complying with the requirements is marketed by Advantest under the type number TQ8325.

FIG. 3 shows diagrammatically a second embodiment of the optical transmission device according to the invention. Likewise as in FIG. 2, the references $\lambda_1, \ldots, \lambda_N$ denote the semiconductor lasers for transmitting the information streams. The radiation from these lasers is passed on to the star coupler 50 via the connections 11 and is combined and split up in this coupler and subsequently transmitted to the subscribers via the outputs 51. The selection device is composed of a number of elements shown within the broken line 10. The radiation from one of the outputs of the star coupler 50, denoted by the reference numeral 52, is combined by means of the coupler 64 with radiation generated by the control laser $\lambda_c$. The combined radiation is passed on through the connection 65 to the opto-electric converter 60. This converter is only sensitive to low frequencies and only supplies an AC signal when the frequency difference between the radiation from the control laser and one of the other semiconductor lasers is sufficiently small. A portion of the control laser radiation is applied to the wavelength meter 20 by means of the coupler 62 and the connection 63. The numerical value of the wavelength of the semiconductor laser radiation determined in this meter, together with the AC signal from the opto-electric converter 60, constitutes sufficient information to determine the real wavelength of the radiation from the semiconductor laser to be measured. By causing the wavelength of the control laser $\lambda_c$ to vary by means of the control circuit 61, the real wavelength of each semiconductor laser $\lambda_1, \ldots, \lambda_N$ can be successively measured, whereafter, if necessary, the laser can be tuned by means of the associated control circuits 41.

What is claimed is:

1. An optical transmission device comprising:
   a. a plurality of semiconductor lasers for transmitting an equal plurality of respective radiation beams modulated with respective information streams and having respective wavelengths which are different for each information stream;
   b. a measuring system for measuring each wavelength including:
      i. a selection device for successively and temporally selecting the respective radiation beams one at a time; and
      ii. a wavelength meter for determining the wavelength of a current one of the respective radiation beams selected by the selection device; and,
   c. a control device for influencing the wavelengths of the semiconductor lasers as a function of a signal generated by the measuring system;
   wherein the selection device is a switching device for establishing and interrupting a respective radiation path from each respective semiconductor laser to the wavelength meter.

2. The device of claim 1 wherein
   (a) each semiconductor laser comprises a control input for receiving a respective control signal for influencing the respective wavelength; and
   (b) the control device comprises a single control means for transmitting respective control signals to all of the semiconductor lasers.

3. An optical transmission device as claimed in claim 1, characterized in that the switching device comprises electro-optical means for establishing and interrupting the respective radiation paths.

4. An optical transmission device comprising:
   a. a plurality of semiconductor lasers for transmitting an equal plurality of respective radiation beams modulated with respective information streams and having respective wavelengths which are different for each information stream, which respective wavelengths fall within a range of wavelengths;
   b. a control laser for emitting radiation of variable wavelength, which variable wavelength has a range which varies throughout the range of wavelengths;
   c. a system of beam-combining elements arranged in a radiation path of the plurality of lasers and of the control laser for providing a combined radiation beam comprising at least a portion of the radiation beams from each laser;
   d. a measuring system for measuring each wavelength including:
      i. an opto-electric converter, cooperating with the control laser and having a wavelength range smaller than a difference between the respective wavelengths of the respective radiation beams, for generating a signal when a frequency difference between the radiation emitted by the control laser and one of the respective radiation beams is sufficiently small; and
      ii. a wavelength meter in a radiation path of the control laser; and
   e. a control device for influencing the wavelengths of the semiconductor lasers as a function of signals generated by the opto-electric converter and the wavelength meter.

5. An optical transmission device as claimed in claim 4, characterized in that the wavelength of the radiation from the control laser is variable by changing both the temperature of and the intensity of the current through the control laser.

6. The device of claim 4 wherein:
   (a) the wavelength meter has:
      (i) an input coupled with the radiation path of the control laser at a first coupling point; and
      (ii) an output coupled with a first input of the control device
   (b) the system of beam combining elements has an input coupled with the radiation path of the control laser at a second coupling point after the first coupling point; and
   (c) the opto-electric converter has
      (i) an input coupled with the radiation path of the control laser after the second coupling point; and
      (ii) an output coupled with a second input of the control device.

7. An optical transmission device as claimed in claim 1, 3, 4, 6 or 5, characterized in that the wavelengths of the radiation emitted by the semiconductor lasers are influenced by influencing the temperature of and the intensity of the current through the semiconductor lasers.

* * * * *